(12) United States Patent
Loertscher et al.

(10) Patent No.: US 11,148,946 B2
(45) Date of Patent: Oct. 19, 2021

(54) CONTACTING MOLECULAR COMPONENTS

(71) Applicants: International Business Machines Corporation, Armonk, NY (US); University of Basel, Basel (CH)

(72) Inventors: Emanuel Loertscher, Bonstetten (CH); Marcel Mayor, Basel (CH); Gabriel Fernando Puebla Hellman, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 16/395,567

(22) Filed: Apr. 26, 2019

(65) Prior Publication Data
US 2019/0248649 A1    Aug. 15, 2019

Related U.S. Application Data

(62) Division of application No. 15/249,963, filed on Aug. 29, 2016, now Pat. No. 10,370,247.

(51) Int. Cl.
| | |
|---|---|
| *H01L 45/00* | (2006.01) |
| *B82Y 30/00* | (2011.01) |
| *H01L 51/50* | (2006.01) |
| *H01G 11/52* | (2013.01) |

(Continued)

(52) U.S. Cl.
CPC .............. *B82Y 30/00* (2013.01); *H01G 11/52* (2013.01); *H01L 45/1253* (2013.01); *H01L 45/16* (2013.01); *H01L 51/502* (2013.01); *B82Y 40/00* (2013.01); *H01L 27/3244* (2013.01)

(58) Field of Classification Search
CPC combination set(s) only.
See application file for complete search history.

(56) References Cited

U.S. PATENT DOCUMENTS

| | | |
|---|---|---|
| 6,989,290 B2 | 1/2006 | Aviram |
| 7,338,711 B1 | 3/2008 | Brousseau, III |
| 7,922,927 B2 | 4/2011 | Kamins et al. |

(Continued)

OTHER PUBLICATIONS

Wikipedia, "Self-Assembled Monolayer," https://en.wikipedia.org/w/index.php?title=Self-assembled_monolayer&printable=yes, Jun. 30, 2016, 10 pages.

(Continued)

*Primary Examiner* — Matthew C Landau
*Assistant Examiner* — Dmitriy Yemelyanov
(74) *Attorney, Agent, or Firm* — Erik Johnson; Ryan, Mason & Lewis, LLP (57) ABSTRACT

A structure including a first layer of one or more molecular components having a first top anchor group, a first functional moiety and a first bottom anchor group. The first functional moiety connects the first top anchor group to the first bottom anchor group. The structure further includes a first conductive film of one or more nanoparticles disposed on the first layer of one or more molecular components. Each of at least a portion of the one or more nanoparticles bond with the first top anchor group of the one or more molecular components. Each of at least a portion of the one or more nanoparticles cross-link with at least one other of the nanoparticles. The first conductive film forms a first contact for the first layer of one or more molecular components.

20 Claims, 6 Drawing Sheets

(51) Int. Cl.
*B82Y 40/00* (2011.01)
*H01L 27/32* (2006.01)

(56) References Cited

U.S. PATENT DOCUMENTS

| | | | |
|---|---|---|---|
| 8,702,944 B2 | 4/2014 | Balagurusamy | |
| 9,168,717 B2 | 10/2015 | Astier et al. | |
| 9,194,860 B2 | 11/2015 | Peng et al. | |
| 9,276,216 B2 | 3/2016 | Nishizawa et al. | |
| 2005/0101063 A1 | 5/2005 | Tour et al. | |
| 2008/0157066 A1* | 7/2008 | Joo | G11C 13/0014 257/40 |
| 2008/0160780 A1* | 7/2008 | Jacobs | G03G 5/153 438/758 |
| 2008/0203055 A1 | 8/2008 | Kamins et al. | |
| 2009/0099044 A1* | 4/2009 | Hutchison | C07H 21/00 506/30 |
| 2009/0188558 A1* | 7/2009 | Jen | B82Y 10/00 136/256 |
| 2009/0230556 A1* | 9/2009 | Mikawa | H01L 45/1233 257/758 |
| 2010/0207112 A1* | 8/2010 | Furst | H01L 51/441 257/40 |
| 2012/0170171 A1* | 7/2012 | Lee | H01G 11/42 361/502 |
| 2013/0161066 A1* | 6/2013 | Imae | B82Y 40/00 174/126.1 |
| 2015/0014624 A1* | 1/2015 | Majima | B82Y 10/00 257/9 |

OTHER PUBLICATIONS

R.M. Metzger et al., "Electrical Rectification by a Monolayer of Hexadecylquinolinium Tricyanoquinodimethanide Measured Between Macroscopic Gold Electrodes," Journal of Physical Chemistry B, Mar. 2001, pp. 7280-7290, vol. 105, No. 30.

R.M. Metzger et al., "Unimolecular Rectifiers: Present Status," Chemical Physics, Jul. 2006, pp. 176-187, vol. 326, No. 1.

List of IBM Patents or Patent Applications Treated as Related.

* cited by examiner

CONTACTING MOLECULAR COMPONENTS

BACKGROUND

Molecular building blocks provide unique opportunities as ultimately-scaled electronic components offering tailored functionalities such as, for example, non-linear transport, rectification, conductance switching, hysteresis or negative differential resistance. These intrinsic functionalities are determined by the chemical design and some of them interact with molecule-extrinsic properties such as voltage, electric field, light, pH, etc. The large variety of quantum mechanical mechanisms controlling transport would in principle allow for next-generation electronics, applicable to standard information technology, quantum and neuromorphic computing, and beyond. Furthermore, molecular compounds can act as selective sensors for sensing applications as well as feedback, storage and acceptor systems in molecular factories and artificial biological systems.

However, a main obstacle to the implementation of such molecular components for the above-mentioned purposes is the extremely small size of molecules of the order of one nanometer ($10^{-9}$ m) which makes contacting of a single molecule or small ensembles of molecules in a well-oriented way and at a well-defined anchoring site an incredibly challenging task, in particular if multiple contacts have to be reliably established on technology-relevant length scales.

SUMMARY

Embodiments provide techniques for contacting one or more molecular components. By way of example only, the molecular components may be self-assembled monolayers (SAMs) of molecules. However, embodiments of the invention are applicable to other types of structures that are composed of one or more molecules such as, but not limited to, crystals, bio-species such as cells, metals, two-dimensional (2D) materials, etc.

In one embodiment, a method for forming a contact to a layer of one or more molecular components comprises depositing one or more nanoparticles on the layer of one or more molecular components. Each of at least a portion of the one or more nanoparticles bond with each of at least a portion of the one or more molecular components. When there is more than one nanoparticle, each of at least a portion of the one or more nanoparticles cross-link with at least one other of the one or more nanoparticles. The bonded and cross-linked nanoparticles form a contact for the layer of one or more molecular components. For example, the contact is both a mechanical and electrical contact.

In another embodiment, a structure comprises a layer of molecular components and a conductive film. The conductive film is comprised of a plurality of nanoparticles formed on the layer of molecular components, wherein each of at least a portion of the nanoparticles bond with each of at least a portion of the molecular components, wherein each of at least a portion of the nanoparticles cross-link with at least one other of the nanoparticles, and wherein the conductive film forms a contact for the layer of molecular components. For example, the contact is both a mechanical and electrical contact.

In yet another embodiment, a structure comprises a layer of molecular components and a hybrid film. The hybrid film is comprised of one or more nanoparticles formed on the layer of molecular components and a conductive layer deposited on top of the nanoparticles, wherein each of at least a portion of one or more nanoparticles bond with each of at least a portion of the molecular components, wherein each of at least a portion of one or more nanoparticles cross-link with at least one other of the nanoparticles and/or the conductive layer. For example, the hybrid film forms both a mechanical and electrical contact for the layer of molecular components.

In a further embodiment, a device comprises: a first electrode; a layer of molecular components formed on the first electrode within an insulating matrix; and a conductive film comprised of one or more nanoparticles formed on the layer of molecular components and the insulating matrix. Each of at least a portion of one or more nanoparticles bond with each of at least a portion of the molecular components. Each of at least a portion of one or more nanoparticles cross-link with at least one other of the nanoparticles. The device further comprises a contact layer formed on the conductive film, wherein the contact layer and the conductive film form a second electrode.

In yet a further embodiment, the first and second electrode together with the insulating matrix seal a molecular film (formed by the layer of molecular components), e.g., to protect the molecular integrity upon exposure of the embodiment to ambient conditions.

In another embodiment, molecules and nanoparticles are assembled with bottom and top contacts to form a cross-bar configuration.

In a still further embodiment, the nanoparticle film acts as protective layer to the molecular film upon deposition of the second electrode material.

These and other exemplary embodiments of the invention will be described in or become apparent from the following detailed description of exemplary embodiments, which is to be read in connection with the accompanying drawings.

DETAILED DESCRIPTION

In illustrative embodiments, techniques are provided for forming molecular component-based structures and devices with contacts thereto that can be used in a wide variety of applications. As mentioned above, although illustrative embodiments will be described herein in the context of a self-assembled monolayer (SAM) of molecules, other types of molecular structures that are composed of one or more molecules may also be implemented including, but not limited to, crystals, bio-species such as cells, metals, and two-dimensional (2D) materials.

Furthermore, it is to be understood that embodiments discussed herein are not limited to the particular materials, features, and processing steps shown and described herein. In particular, with respect to formation (fabricating or processing) steps, it is to be emphasized that the descriptions provided herein are not intended to encompass all of the steps that may be used to form a functional structure or device. Rather, certain steps that are well known that are used in forming such structures and devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as may be used herein with regard to thicknesses, widths, percentages, ranges, etc., are meant to denote being close or approximate to, but not exactly. For example, the term "about" or "substantially" as used herein implies that a small margin of error may be present. Also, in the figures, the illustrated scale of one layer, structure, and/or region relative to another layer, structure, and/or region is not necessarily intended to represent actual scale.

It is realized that the success of complementary metal-oxide semiconductor (CMOS) technology is mainly based on its gradual miniaturization leading to an increase of the computing power or the storage density. Physical limitations, however, are expected to hinder this trend in the coming years. In addition, new computing paradigms require novel functionalities that allow more advanced operations beyond the ones known from conventional charge-transport properties of semiconductor-based devices. The vision is to employ quantum mechanical effects and highly non-linear functionalities combined with very abrupt responses to external triggers at low energies. Even though molecular building blocks are composed of a few atoms and therefore represent ultimately scaled devices, they offer a large variety of such quantum mechanical-based functionalities wherefrom most of them can be addressed by simple external triggers.

It is to be further appreciated that such structures can be used in non-electronic applications, e.g., chemistry, bio (molecular factories), to be used as sensing elements, etc.

The problem, however, lies less in the variety of potential functionalities suitable for electronic applications which molecular building blocks may offer than in the fabrication of reliable devices based on a few or even single molecules acting as active components in a circuit. The standard approach so far is to evaporate, spin-coat or spray-coat molecular films several 10 to several 100 nm in thickness, followed by a top contact fabrication via metal deposition. In these so-called organic electronic devices, even though the functionality is determined by molecular properties, the electronic characteristics are carried by a large entity of molecules without specific orientation, e.g., with respect to the field gradient in a transistor-like geometry. To have molecules aligned properly to an electric field and to be able to use the two electrodes as a trigger or probing elements, SAMs have to be fabricated where the molecular film is constrained nominally to the length of a single molecule by the two electrodes in the relevant dimension (referred to as the z-axis) and multiple dimensions to define the active area (referred to as x-/y-axes).

A large variety of contact procedures has been developed in the past, aiming at electrically contacting SAMs. They include, for example: probe-based approaches such as the scanning tunneling microscope (STM) or the atomic force microscope (AFM); mercury (Hg) droplet approaches where the top contact is established by droplet of liquid Hg confined by high-surface-tension; direct metal deposition; cold indirect metal deposition; micro-contact printing of metal, graphene or 2D layered materials; and organic spacer layer where a layer of conducting polymer acts as an intermediate protective layer.

All of the above mentioned existing techniques have severe limitations as explained below.

In probe-based approaches, the contact area is often uncertain, cannot be varied, and the scalability to multiple nodes on wafer scales is impracticable.

Mercury droplets tend to form an amalgam with the bottom electrode if not passivated sufficiently. Passivation by molecular films leads to an additional series resistance. Similar to probe-based approaches, the contact area cannot be varied and the scalability to multiple nodes on wafer scales is impracticable Direct metal deposition results in hot atoms arriving with high kinetic energies on the SAM, interacting severely with the SAM, affecting its chemical integrity by oxidation, metal filament formation, etc.

Cold metal evaporation reduces the high kinetic energy by letting the atoms first scatter on the chamber walls before getting in contact with the SAM. However, oxidation, metal filament formation, etc., have been found to take place Printing as a non-conformal method is limited with respect to the non-planar architecture and suffers from weak orbital interactions, e.g., in the case of graphene or other 2D layered material.

Organic spacer layers based on PEDOT polymers introduce a significant series resistance which can easily surpass that of the molecular layer, as well as limited penetration of small pores.

To summarize, all existing methods to contact SAMs of molecules fail in establishing a gentle, reliable and conformal contact. This has so far prevented molecular building blocks to be reliably integrated at the wafer-scale.

Illustrative embodiments address the above and other drawbacks and limitations of existing approaches by providing a method to establish a gentle and reliable contact to a molecular component layer such as a SAM by using semi-stabilized nanoparticles. This conformal and protective metallization layer for SAMs is considered a practical solution to integrate SAMs into large-area devices.

More particularly, illustrative embodiments provide a contact preparation method that enables mechanical and electrical contact to a SAM to be established in a gentle and non-destructive way. Semi-stabilized nanoparticles have weakly bound ligand shells where the later can be exchanged or released. Such nanoparticles are deposited from solution or gas phase and can assemble on top of the SAM, making contact to the SAM by forming molecule-metal bonds between the nanoparticle core and the molecular anchor group and cross-links due to partial or complete release or exchange of the ligand shell surrounding the nanoparticle body. The ligand shell is not mandatory for the functionality but is used in practice to prevent agglomeration in solution. By way of example, a ligand is an ion or molecule attached to a metal atom by coordinative, covalent, electrostatic, or van-der-Waals interaction. Ligand shell release may be proximity-induced (passive) or induced by an active mechanism such as, for example, introduction of electricity, heat, light, or chemical additives. The ligand shell can also be exchanged by using other types of ligands, e.g. conductive ones.

After assembly, a dense top-contact is formed that provides: a) the required electrical contact to the SAM; and b) a protective layer for further processing. Importantly, the chemical integrity of the SAM is not affected by the gentle contacting approach proposed. By this approach, e.g., devices based on SAMs in nanopores may be fabricated on wafer scales with unprecedented device yield and low fluctuations in the device properties while maintaining the chemical integrity of the molecular compounds. This leads to a room-temperature stable platform for molecular electronics with electrical, optical or electrochemical access. It enables the use of highly sensitive molecular compounds for electro-chemical sensing, light-detection and emission, partial release or storage of molecular compounds.

Furthermore, as will be depicted and described below in the context of FIGS. 1A through 5B, illustrative embodiments provide a combination of top-down fabrication and bottom-up assembly and release mechanisms such as, for example:

i) Molecular compounds are self-assembled with a well-defined orientation, forming a SAM;

ii) The composition of the SAM can be homogenous (identical types of molecular compounds) or heterogeneous (multiple types of molecular compounds);

iii) One or more insulating matrices are formed that: define spatial boundaries constraining the SAM laterally (in x- and y-axis); comprise one or more openings with diameters down to the nanometer range; act as a spacer between the first electrode and the second electrode; and/or act repulsively to the nanoparticles;

iv) The SAM is grown on the planar bottom electrode within the boundary set by the insulating matrix and the openings in the insulating matrix;

v) Electrical contact from the bottom electrode to the SAM is established via an anchoring group;

vi) Nanoparticles form a conformal top contact to the SAM;

vii) Electrical contact from the SAM to the top contact is established via an anchoring group;

viii) An evaporated metal layer on top of the particles reinforces the device, hermetically seals the molecular film and provides the bulk contact for wiring.

ix) an evaporated metal layer on top of the particles forms an electronic circuit, e.g., in a cross-bar orientation of bottom and top electrodes.

Given the above described features and advantages of molecular component-based structures and devices with gentle and non-destructive contact formation, one or more illustrative embodiments will now be described in the context of the figures.

Figure 1A:
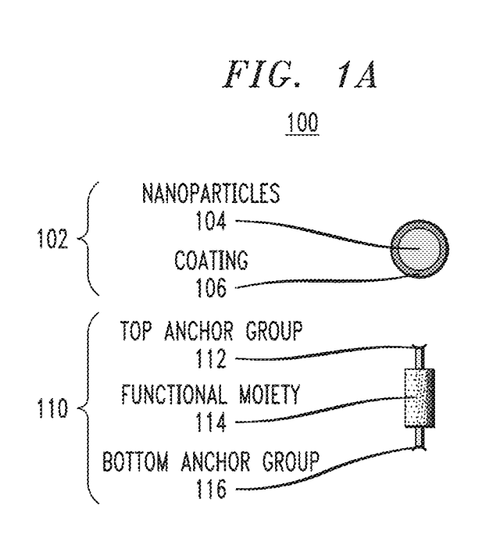
FIG. 1A is a schematic cross-sectional side view of a nanoparticle and a molecular component, according to an embodiment of the invention.
Figure 1B:
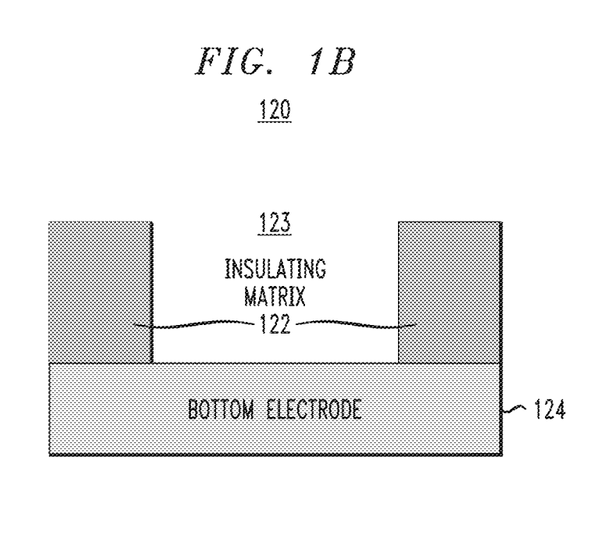
FIG. 1B is a schematic cross-sectional side view of device components, according to an embodiment of the invention.

FIGS. 1A and 1B respectively illustrate components 100 and 120 used to form a molecular component-based device, according to one illustrative embodiment.

First, as shown in FIG. 1A, a nanoparticle 102 is comprised of a nanoparticle body 104 and a coating 106. The coating 106 is a ligand shell. Thus, the coating 106 is a molecular shell around the body 104 of the nanoparticle that serves to stabilize the nanoparticle and prevents agglomeration of multiple nanoparticles to a cluster in solution. The ligand shell is usually non-conducting. No ligand shell is used in gas phase deposition. The nanoparticle can consist of any conductive or semi-conductive material depending on the specific purpose of the device in which it will be used. In one example, nanoparticles can be composed of gold (Au). In one exemplary CMOS-compatible device, the nanoparticle can be composed of a non-Au material such as, by way of example only, Platinum (Pt), Palladium (Pd), or any material with similar properties. Nanoparticles can further have heterogeneous compositions. Nanoparticles of different material compositions and sizes are commercially available and can be made based on the specific functionalities they will serve and dimensions required for the packing density of the environment in which they will be deployed. One or more nanoparticles 102, as will be seen in the figures and described below, form the conductive film that serves as a mechanical and electrical contact for the underlying SAM. Examples of geometries of nanoparticles are spherical, squared hollow-spherical, toroidal, rod-like, etc.

Additionally, FIG. 1A shows the composition of a molecular component 110 that makes up the SAM. The molecular component 110 is comprised of a top section 112 that serves as a top anchor group, a middle section 114 that serve as a functional moiety, and a bottom section 116 that serves as a bottom anchor group. The chemical composition of the top and bottom anchor groups 112 and 116 is dependent on the target binding material for that anchor group. Examples may include, but are not limited to, thiol-linkers, isocyanides, pyridyles, isothiocyanates, dithiocarbanates, fullerenes, and direct C-metal bonds. The chemical composition of the functional moiety 114 depends on the function to be performed by the molecular component 110 as part of the device in which it will reside. Thus, the molecular component 110 carries the molecular-intrinsic device functionality 114, and two (not stringently identical) anchor groups 112 and 116 with high affinity for bonding to bottom and top electrode layer materials. By use of non-identical anchoring groups with a different affinity to the bottom electrode, the molecules can be assembled with a well-defined orientation. One or more molecular components 110, as will be seen in the figures and described below, form a molecular film (in this example, a SAM of molecules) upon which the conductive film of nanoparticles 102 is formed.

Turning to FIG. 1B, device components 120 of the molecular component-based device according to the illustrative embodiment are shown. More particularly, as depicted, an insulating matrix 122 (a pair of matrices) defines an opening 123 (e.g., a pore, trench) in the insulting matrix and is formed on top of a bottom electrode 124. The bottom electrode may be formed by any conductive material that enables the bottom anchor group to bind on it. Examples comprise but are not limited to metals such as Au, Pd, Pt etc., as well as two-dimensional (2D) materials such as graphene, $VO_2$, $MO_2$ or conductive polymers. The above-mentioned molecular film (SAM) and conductive film (nanoparticles) are formed within the opening 123. While only one opening 123 is shown for ease of explanation, it is to be appreciated that more than one opening 123 may be formed between insulating matrices on top of the bottom electrode 124. The insulating matrix may be formed by dielectric materials such as oxides or polymers but also 2D materials including porous materials.

Figure 1C:
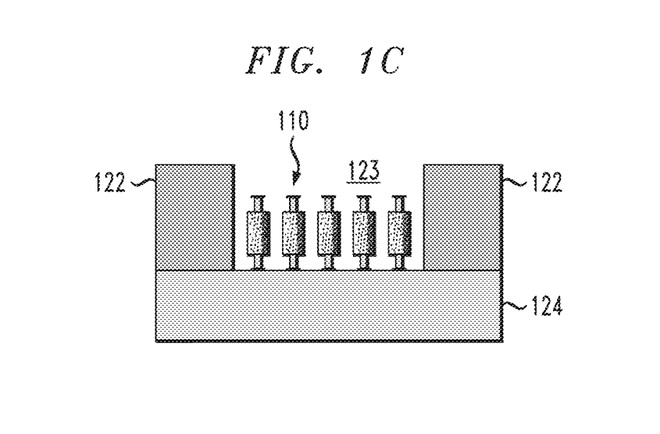
FIG. 1C is a schematic cross-sectional side view of a device illustrating molecular assembly, according to an embodiment of the invention.
Figure 1D:
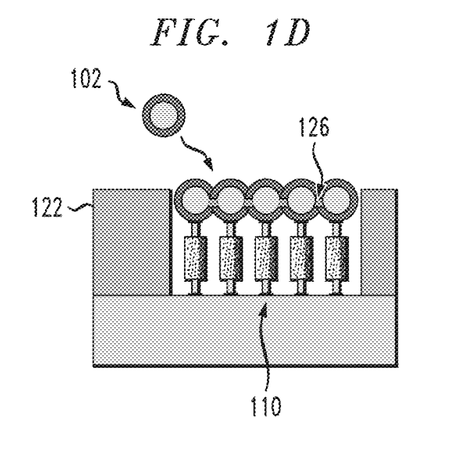
FIG. 1D is a schematic cross-sectional side view of a device illustrating top contact assembly, according to an embodiment of the invention.
Figure 1E:
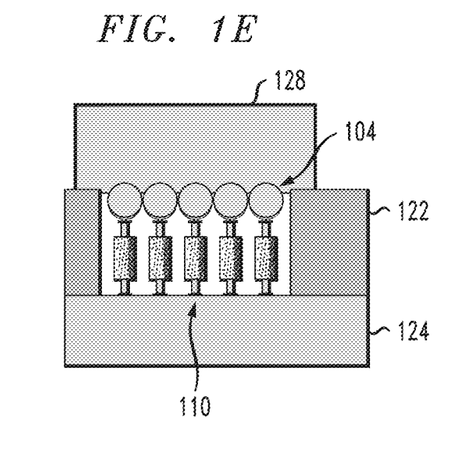
FIG. 1E is a schematic cross-sectional side view of a device illustrating top contact sealing, according to an embodiment of the invention.

FIGS. 1C, 1D, and 1E depict formation of the molecular component-based device. The device is composed of the components depicted in FIGS. 1A and 1B.

First, as shown in FIG. 1C, molecular components 110 are self-assembled into the openings 123 of the insulating (oxide) matrix 122 with a preferred assembly on the bottom electrode 124 with respect to the insulating matrix.

Then, as shown in FIG. 1D, nanoparticles 102 are assembled from a solution or gas phase, making both mechanical and electrical contact with the top anchor groups 112 of the molecular components. Note that while multiple nanoparticles 102 and molecular components 110 are shown in this device, a device may be formed with a single nanoparticle 102 bound to a single molecular component 110. However, in the case of more than one nanoparticle deposition, nanoparticles 102 may cross-link among each other either spontaneously in case there is no ligand around or by partial or complete release or exchange of the ligand shell as shown in FIG. 1D. More particularly, a cross-link 126 is formed between nanoparticles 102 in the areas of where the ligand shell (coating 104) has been released due to release of the ligand. By cross-linking or ligand exchange from insulating to conductive species, an electrical contact is formed between the nanoparticles.

Lastly, as shown in FIG. 1E, the top contact may optionally but does not mandatorily be reinforced by fabricating a second top contact layer 128 (via a printing process, an evaporation process, etc.) which hermetically seals the device (FIG. 1E). The nanoparticles 102 and the contact layer 128 also may bond to form a hybrid film that serves as the electrical and mechanical contact to the layer of molecular components 110. The second top contact may remove the ligand shell partially or completely (by the available thermal energy upon evaporation, for instance) leading to the formation of an electrical contact between the second top contact layer and the nanoparticles and/or among the nanoparticles. It is also possible to remove the shell before adding the top contact.

Again, it is to be understood that while FIGS. 1C, 1D and 1E show the assembly of a device with a single opening 123, illustrative embodiments may have multiple such openings with SAM and nanoparticle layers formed therein similarly to those shown in FIGS. 1C, 1D and 1E.

Accordingly, the device formed as explained above provides a solution to all of the above-mentioned issues associated with existing approaches by using nanoparticles as a conformal, active, protecting and sealing interfacial layer to SAMs. Advantageously, after SAM formation as explained above, nanoparticles are brought in contact with the SAM (either from a solution or the gas phase), and due to their small size (typically in the range from about 1.5 to 50 nm), no high temperatures steps are required, also for deposition from the gas phase.

Furthermore, the nanoparticles interact with the SAMs top surface which is determined primarily by the anchor groups that have a certain chemical affinity to bind the nanoparticles. Due to their small size, the nanoparticles will conformally coat the SAM, compensating for height variations on a scale similar to the particle diameter. Further, the repulsive character of the ligand shell ensures that the nanoparticles do not form clusters in solution. In gas phase or at low concentrations in solution, there are ways to circumvent the usage of a ligand shell.

The weakly bound ligands can be displaced, allowing a contact to be established between the reactive top anchor group and the nanoparticle. The ligand shell may be further released or displaced to allow cross-linking amongst the nanoparticles. The small size of the nanoparticles and the cross-linking behaviour leads to a surface coverage with none or only minor defects which makes the nanoparticle film fully electrically conducting. The nanoparticle top electrode is dense and thermally conductive enough to allow for subsequent top contact evaporation and structuring, acting as a protective layer and inhibiting filament formation between the additional top contact and the bottom electrode throughout the SAM causing device shortage. This top-contact reinforcement furthermore hermetically seals the SAM and yields devices stable at ambient or even elevated-temperature conditions.

Figure 2A:
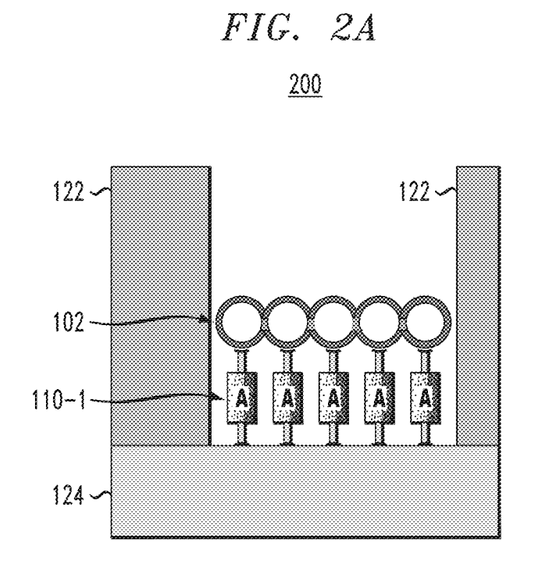
FIG. 2A is a schematic cross-sectional side view of device illustrating a first intermediate step for multilevel alignment of molecular hetero-structures, according to an embodiment of the invention.
Figure 2B:
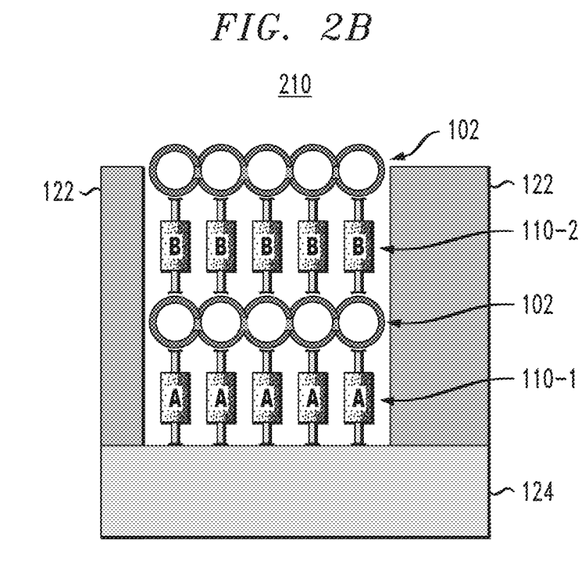
FIG. 2B is a schematic cross-sectional side view of device illustrating a second intermediate step for multilevel alignment of molecular hetero-structures, according to an embodiment of the invention.

Illustrative embodiments also provide multilevel stacking to create hetero-structures, e.g., for photovoltaic (PV) charge separation, e.g. by creating hole and electron transport layers. FIGS. 2A and 2B illustrate intermediate steps for multilevel alignment of molecular hetero-structures, according to an illustrative embodiment.

As shown, a similar device composition as in FIGS. 1A through 1E is employed in the hetero-structure of FIGS. 2A and 2B. As shown in intermediate structure 200 in FIG. 2A, an insulating matrix 122 is formed on a bottom electrode 124 forming an opening 123. Further, similar to the device of FIGS. 1A through 1E, a layer of molecular components is formed on top of the bottom electrode 124. The molecular components are denoted as 110-1 (labeled A). It is understood that the molecular components 110-1 have a first functional moiety associated therewith. Next, a layer of nanoparticles 102 are deposited on the molecular layer 110-1 in the same manner as explained above (i.e., the nanoparticles bond to the molecules and the nanoparticles cross-link with one another).

Next, as shown in intermediate structure 210 in FIG. 2B, a second layer of molecular components is formed on top of the first layer of nanoparticles. The second layer of molecular components are denoted as 110-2 (labeled B). It is understood that the molecular components 110-2 have a second functional moiety associated therewith, which can be different than the functional moiety of the first molecular layer 110-1. Next, a second layer of nanoparticles 102 is deposited on top of the molecular layer 110-2 in the same manner as explained above (i.e., the nanoparticles bond to the molecules and the nanoparticles cross-link with one another). As such, a molecular component-based device is formed with a hetero-structure that advantageously provides multiple functionalities within the same device.

A heterogeneous assembly of molecules can also be established by sequential build-up of the molecular layers without the need of having an intermediate nanoparticle layer.

An example of hetero-structure architectures may include a molecular or nanoparticles layer with current-rectifying properties, and a second layer with other electronic functionalities, e.g., conductance switching or charge-storing properties. One example is the cross-bar architecture to be described below in the context of FIGS. 5A and 5B, as the rectification is required to address a single node by rejecting currents flowing through other signal lines.

It is to be appreciated that illustrative embodiments provide multilevel architectures with more than two layers of molecules and more than two layers of nanoparticles by repeating the process described herein multiple times.

Notably, structures with heterogeneous molecular and/or nanoparticle assemblies can be sequentially built-up to form multilevel architectures of more than two layers by applying above mentioned process multiple times. Last, the top nanoparticle layer can be sealed again by depositing a second top-contact.

Figure 3A:
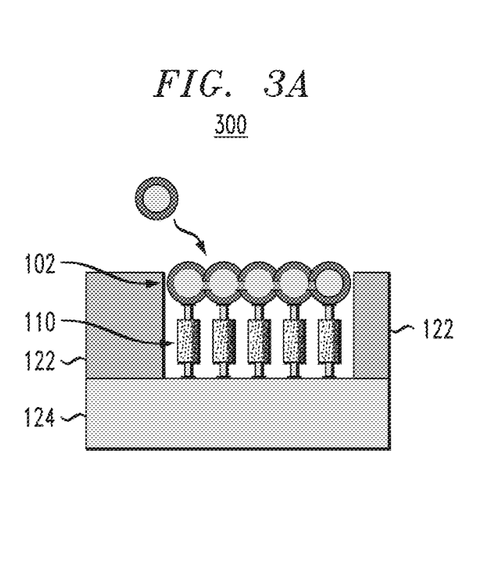
FIG. 3A is a schematic cross-sectional side view of device illustrating a first intermediate step for forming one or more optically transparent electrodes, according to an embodiment of the invention.
Figure 3B:
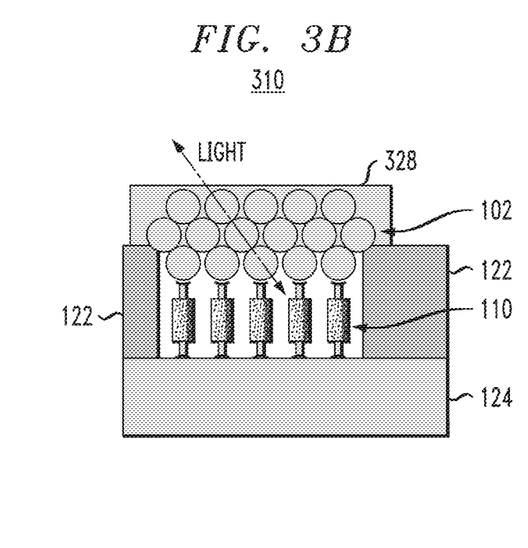
FIG. 3B is a schematic cross-sectional side view of device illustrating a second intermediate step for forming one or more optically transparent electrodes, according to an embodiment of the invention.

Further illustrative embodiments provide semi-transparent nanoparticle-based top electrodes (further embedded, e.g., by indium tin oxide or ITO) for optical applications such as photon interactions with the SAM (e.g., sensors, light-harvesting devices for photovoltaic (PV) applications, etc.) or light emission from the SAM (organic light emitting diodes or OLEDs, displays, etc.). FIGS. 3A and 3B illustrate intermediate steps for forming one or more semi-transparent electrodes, according to an illustrative embodiment. As shown in intermediate structure 300 in FIG. 3A, a molecular layer (110) and a nanoparticle layer (102) are formed between insulating matrix 122 on top of bottom electrode 124. In intermediate structure 310 in FIG. 3B, a contact layer 328 is formed over the nanoparticles in a similar manner as layer 128 in FIG. 1E. However, in this embodiment, the nanoparticles 102 and contact layer 328 are composed of material that allows light to pass from outside the device to the molecular layer (110). This light transparency functionality serves the one or more optical applications mentioned herein. The second top electrode layer may lead to a partial or complete release of the ligand shell such that an electrical contact is formed between the second top electrode and the nanoparticles as well as among the nanoparticles.

Figure 4A:
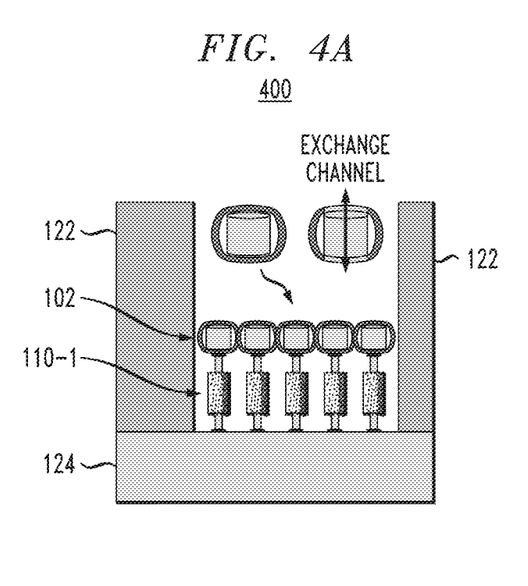
FIG. 4A is a schematic cross-sectional side view of device illustrating a first intermediate step for forming one or more transparent electrode layers enabling mass or ionic flow, according to an embodiment of the invention.
Figure 4B:
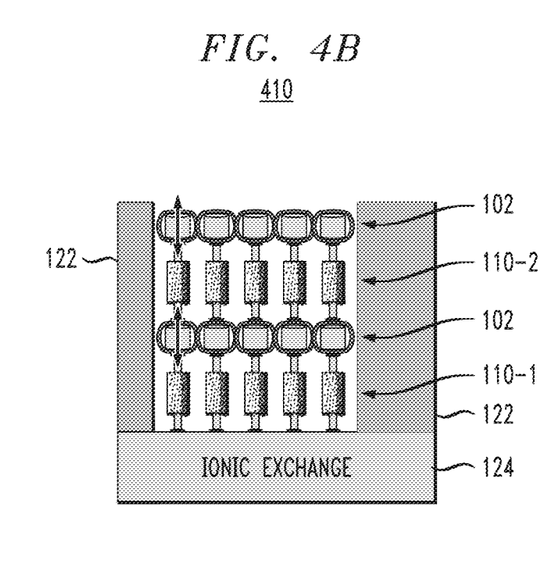
FIG. 4B is a schematic cross-sectional side view of device illustrating a second intermediate step for forming one or more transparent electrode layers enabling mass or ionic flow, according to an embodiment of the invention.

Still further, illustrative embodiments may be configured to use nanoparticles with specific shapes and functionalities, e.g., torus-like or tube-like, or porous morphology to create membrane-like, ionically- and molecularly-transparent structures that are still electrically conducting interfacial layers, e.g. for electrochemical, biological and medical applications enabling ionic and mass exchange. FIGS. 4A and 4B illustrate intermediate steps for forming one or more transparent electrode layers enabling mass or ionic flow, according to an illustrative embodiment. As shown in intermediate structure 400 in FIG. 4A, a molecular layer having a first functional moiety (110-1) and a nanoparticle layer (102) are formed between insulating matrix 122 on top of bottom electrode 124. In intermediate structure 410 in FIG. 4B, a molecular layer having a second functional moiety (110-2) and a nanoparticle layer (102) are formed on top of the first nanoparticle layer. The two molecular layers (110-1 and 110-2) may have different or the same functional moieties depending on the application. However, in this embodiment, note how the nanoparticles and molecules are transparent to ionic and mass exchange between the bottom electrode 124 and the top electrode formed by the second nanoparticle layer (and, if present, a contact layer formed over the second nanoparticle layer (not explicitly shown)). This ionic and mass exchange functionality serves the one or more electrochemical, biological and medical applications mentioned herein.

In an additional embodiment, quantum-dot like nanoparticles can be used for enhanced optical and electronic interactions in close proximity to metal surfaces or molecular compounds or to implement additional functionalities that arises from their quantum-dot properties.

Figure 5A:
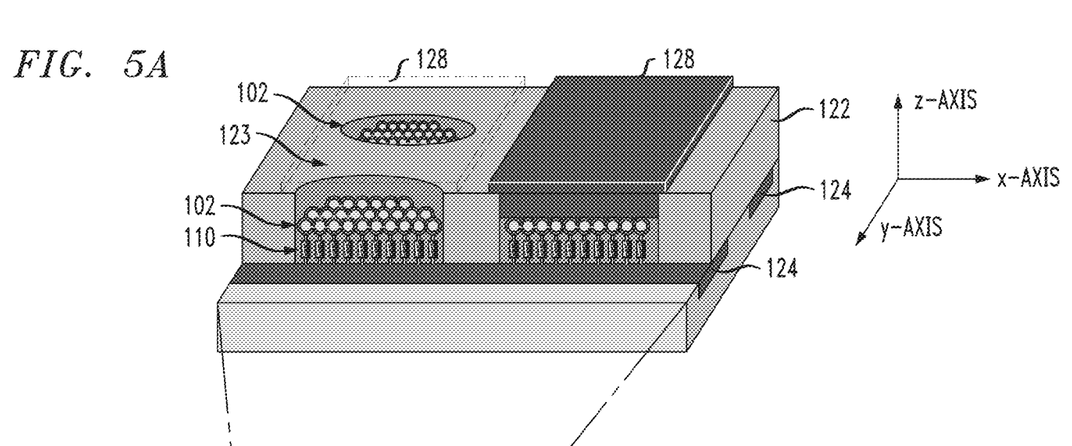
FIG. 5A is a three-dimensional view of molecular compounds assembled in nanopores formed by an insulating matrix and bottom and top electrodes arranged in a cross-bar architecture, according to an embodiment of the invention.
Figure 5B:
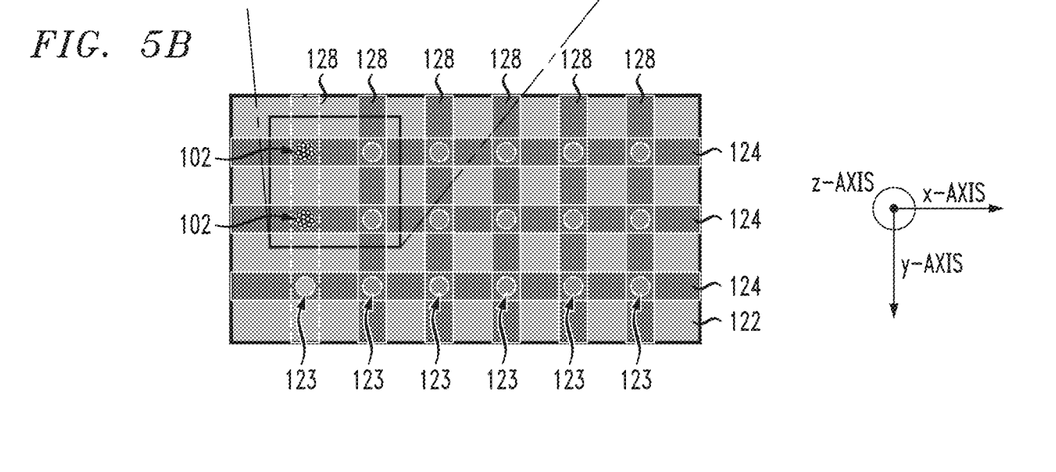
FIG. 5B is a top view illustrating orientation of bottom and top electrodes in the cross-bar architecture of FIG. 5A.

FIG. 5A is a three-dimensional view of molecular compounds assembled in nanopores formed by an insulating matrix and bottom and top electrodes arranged in a cross-bar architecture, according to an embodiment of the invention. FIG. 5B is a top view illustrating orientation of bottom and top electrodes in the cross-bar architecture of FIG. 5A.

More particularly, the cross-bar architecture shown in FIGS. 5A and 5B is formed using one or more of the processes and structures described above with respect to FIGS. 1A through 1E. Thus, it is noted that the same reference numerals are used in FIGS. 5A and 5B as are used above in the description of FIGS. 1A through 1E. Furthermore, the variations described in FIGS. 2A and 2B, 3A and 3B, 4A and 4B may be implemented in the cross-bar architecture.

As shown in FIGS. 5A and 5B, the molecules 110 and nanoparticles 102 are assembled in the openings (nanopores) 123, as previously described, and bottom contacts 124 and top contacts 128 are formed as shown in a criss-cross type pattern, i.e., referred to as a cross-bar configuration.

Molecular component-based structures and devices formed in accordance with illustrative embodiments can be integrated in a wide variety of device architectures including, but not limited to: nanopores with semi-transparent electrodes for optical applications; cross-bar memories for electronic storage; two dimensional (2D) and three dimensional (3D) neuromorphic networks (multiple layers, cross-bar architecture); quantum computing with strongly coupled molecules—quantum dots (close proximity with shortest interaction/propagation lengths at maximum field conditions); sensing devices (local electrochemical/ionic potential); optical, plasmon-mediated processes due to the short molecule-metal distance (field enhancements); reaction compartments for controlled molecular interactions; and ionic/electronic storage with well-defined capacitance layers (e.g., super capacitors, pseudo capacitors); molecular, cell, etc. storage and release elements.

Molecular component-based structures and devices formed in accordance with illustrative embodiments can also be used in a wide variety of applications including, but not limited to: memory, sensing, light-emitting devices, displays, photovoltaic devices, neuromorphic networks, neuromorphic computing, electronic and optical reservoir computing, bio-medical reactions, controlled reaction and feedback operations in compartment and molecular factories, local electrochemistry, batteries, and security tags (unique combinations of surface plasmonic particles (SPP)/molecules/nanoparticles for optical response).

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:
1. A structure, comprising:
a bottom electrode;

an insulating layer disposed on the bottom electrode, the insulating layer having an opening therein and configured to expose a top surface of the bottom electrode;

a first layer disposed in the opening of the insulating layer, the first layer comprising a plurality of molecular components, each having a first top anchor group, a first functional moiety and a first bottom anchor group, wherein the first functional moiety connects the first top anchor group to the first bottom anchor group, the bottom anchor being attached to the top surface of the bottom electrode;

a first conductive film comprising a plurality of first nanoparticles disposed on the first layer of the plurality of molecular components, wherein each of at least a portion of the plurality of first nanoparticles covalently bond, respectively, with the first top anchor group of each of at least a portion of the plurality of molecular components, wherein each of at least a portion of the plurality of first nanoparticles cross-link with at least one other of the plurality of first nanoparticles to covalently bond with each other, and wherein the first conductive film forms a first contact for the first layer of the plurality of molecular components;

a second layer of a plurality of molecular components disposed on the first conductive film, each of the plurality of molecular components having a second top anchor group, a second functional moiety and a second bottom anchor group, wherein the second functional moiety connects the second top anchor group to the second bottom anchor group; and a second conductive film comprising a plurality of second nanoparticles disposed on the second layer of the plurality of molecular components, wherein each of at least a portion of the plurality of second nanoparticles bond, respectively, with the second top anchor group of each of at least a portion of the plurality of molecular components, wherein each of at least a portion of the plurality of second nanoparticles cross-link with at least one other of the plurality of second nanoparticles to covalently bond with each other, and wherein the second conductive film forms a second contact for the second layer of the plurality of molecular components.

2. The structure of claim 1, wherein the first layer of the plurality of molecular components comprises a structure selected from a group consisting of: a self-assembled monolayer of molecules, a crystal, a cell, a metal, and a two-dimensional material.

3. The structure of claim 1, wherein the plurality of first nanoparticles are disposed on the first layer of the plurality of molecular components via a solution.

4. The structure of claim 1, wherein the plurality of first nanoparticles are disposed on the first layer of the plurality of molecular components via gas phase.

5. The structure of claim 1, wherein each of the at least portion of the plurality of first nanoparticles that bond with the respective first top anchor group of each of the plurality of molecular components comprises a molecule-metal covalent bond therebetween.

6. The structure of claim 5, wherein the molecule-metal covalent bond between a given one of the first nanoparticles and a given one of the first top anchor group of the plurality of molecular components is based on a chemical affinity of the first top anchor group associated with the molecular component.

7. The structure of claim 1, wherein each of the plurality of first nanoparticles cross-link with the at least one other of the plurality of first nanoparticles due to a release of at least a portion of a ligand shell of each nanoparticle.

8. The structure of claim 1, wherein a contact layer forms a hermetic seal over the plurality of first nanoparticles and the plurality of molecular components.

9. The structure of claim 1, wherein the plurality of first nanoparticles comprises one or more elements with one or more of an optically transparent property, a molecularly transparent property, and an atomically transparent property.

10. A device, comprising:

a first electrode;

an insulating layer disposed on the first electrode, the insulating layer having an opening therein and configured to expose a top surface of the first electrode;

a first layer disposed in the opening of the insulating layer, the first layer comprising a plurality of molecular components, each having a first top anchor group, a first functional moiety and a first bottom anchor group, wherein the first functional moiety connects the first top anchor group to the first bottom anchor group, the bottom anchor being attached to the top surface of the first electrode; and a first conductive film comprising a plurality of first nanoparticles disposed on the first layer of the plurality of molecular components, wherein each of at least a portion of the plurality of first nanoparticles covalently bond, respectively, with the first top anchor group of each of at least a portion of the plurality of molecular components, wherein each of at least a portion of the plurality of first nanoparticles cross-link with at least one other of the plurality of first nanoparticles to covalently bond with each other, and wherein the first conductive film forms a first contact for the first layer of the plurality of molecular components;

a second layer of a plurality of molecular components disposed on the first conductive film, each of the plurality of molecular components having a second top anchor group, a second functional moiety and a second bottom anchor group, wherein the second functional moiety connects the second top anchor group to the second bottom anchor group;

a second conductive film comprising a plurality of second nanoparticles disposed on the second layer of the plurality of molecular components, wherein each of at least a portion of the plurality of second nanoparticles bond, respectively, with the second top anchor group of each of at least a portion of the plurality of molecular components, wherein each of at least a portion of the plurality of second nanoparticles cross-link with at least one other of the plurality of second nanoparticles to covalently bond with each other, and wherein the second conductive film forms a second contact for the second layer of the plurality of molecular components; and a contact layer disposed on the second conductive film, wherein the contact layer and the first second conductive film form a second electrode.

11. The device of claim 10, wherein the insulating layer has at least one of the following properties: one or more openings; acts as a spatial constraint for the molecular components; and acts as a spacer between the first electrode and the second electrode.

12. The device of claim 10, wherein the first electrode and the second electrode are positioned in a cross-bar configuration.

13. The device of claim 10, wherein the plurality of first nanoparticles are disposed on the first layer of the plurality of molecular components via a solution.

14. The device of claim 10, wherein the plurality of first nanoparticles are disposed on the first layer of the plurality of molecular components via gas phase.

15. The device of claim 10, wherein each of the at least portion of the plurality of first nanoparticles that bond with the respective first top anchor group of each of the plurality of molecular components comprises a molecule-metal covalent bond therebetween.

16. The device of claim 15, wherein the molecule-metal covalent bond between a given one of the first nanoparticles and a given one of the first top anchor group of the plurality of molecular components is based on a chemical affinity of the first top anchor group associated with the molecular component.

17. The device of claim 10, wherein each of the plurality of first nanoparticles cross-link with the at least one other of the plurality of first nanoparticles due to a release of at least a portion of a ligand shell of each nanoparticle.

18. The device of claim 10, wherein the first contact layer forms a hermetic seal over the plurality of second nanoparticles and the plurality of molecular components.

19. The structure of claim 1, wherein each of at least a portion of the plurality of second nanoparticles covalently bond, respectively, with the second top anchor group of each of at least a portion of the plurality of molecular components.

20. The device of claim 10, wherein each of at least a portion of the plurality of second nanoparticles covalently bond, respectively, with the second top anchor group of each of at least a portion of the plurality of molecular components.

* * * * *